United States Patent [19]

Conti et al.

[11] Patent Number: 5,328,868

[45] Date of Patent: Jul. 12, 1994

[54] METHOD OF FORMING METAL CONNECTIONS

[75] Inventors: Richard A. Conti, Mount Kisco; Kenneth DeVries, Hopewell Junction; James F. White, Newburgh, all of N.Y.

[73] Assignee: International Business Machines Corporation, Armonk, N.Y.

[21] Appl. No.: 989,742

[22] Filed: Dec. 10, 1992

Related U.S. Application Data

[63] Continuation of Ser. No. 820,506, Jan. 14, 1992, abandoned.

[51] Int. Cl.⁵ .................... H01L 21/44; H01L 21/48
[52] U.S. Cl. .................... 437/203; 437/927; 437/924; 148/DIG. 50; 148/DIG. 73
[58] Field of Search ............ 437/80, 203, 924, 927; 148/DIG. 50, DIG. 73

[56] References Cited

U.S. PATENT DOCUMENTS

| 4,262,399 | 4/1981 | Cady | 437/80 |
| 4,334,348 | 6/1982 | Trenary et al. | 148/DIG. 50 |
| 4,339,305 | 7/1982 | Jones | 437/203 |
| 4,448,797 | 5/1984 | Burnham | 148/DIG. 50 |
| 4,650,696 | 3/1987 | Raby | 427/89 |
| 4,692,994 | 9/1987 | Moniwa et al. | 148/DIG. 50 |
| 4,757,033 | 7/1988 | Ebata | 437/228 |
| 4,789,648 | 12/1988 | Chow et al. | 437/225 |
| 4,795,722 | 1/1989 | Welch et al. | 437/192 |
| 4,804,560 | 2/1989 | Shioya et al. | 437/192 |
| 4,888,300 | 12/1989 | Burton | 437/239 |
| 4,902,533 | 2/1990 | White et al. | 437/228 |
| 4,996,133 | 2/1991 | Brighton et al. | 437/228 |
| 4,999,314 | 3/1991 | Pribat | 148/DIG. 50 |
| 5,000,818 | 3/1991 | Thomas et al. | 437/203 |
| 5,006,478 | 4/1991 | Kobayashi et al. | 437/80 |

OTHER PUBLICATIONS

"IBM Technical Disclosure Bulletin"; vol. 32, No. 1; Jun. 1989; pp. 164–165.

Primary Examiner—Tom Thomas
Assistant Examiner—Trung Dang
Attorney, Agent, or Firm—Whitham, Curtis & Whitham

[57] ABSTRACT

A metal connection for an integrated circuit device is effectively "cast" in place at any level of an integrated circuit. The "mold" for the connection is formed by depositing and patterning a sacrificial material, such as aluminum oxide or other metal oxides, and covering the sacrificial material with a protective material such as silicon dioxide or other insulators. After forming bore holes to the deposit of sacrificial material through the protective layer, the sacrificial material is removed by isotropic etching to form a cavity beneath and at least partially overlaid by the protective layer. Alternatively, a defect may be produced below the protective layer and filled with metal either with or without enlargement by further removal of material. This cavity is then filled with metal by deposition of the metal by, for instance, evaporation, sputtering and chemical vapor deposition or combinations thereof. Connections formed by this technique can be produced at any level of the integrated circuit and do not interfere with surface wiring. A plurality of such connections may be simultaneously formed at the same or different levels of the integrated circuit and the method may be repeated to form multi-level wiring patterns.

8 Claims, 3 Drawing Sheets

METHOD OF FORMING METAL CONNECTIONS

This is a continuation of U.S. patent application Ser. No. 07/820,506, filed Jan. 14, 1992 abandoned.

BACKGROUND OF THE INVENTION

1. Field of the Invention

The present invention generally relates to the fabrication of integrated circuits and, more particularly, to the formation of connections between contact areas thereon, such as contact studs or metal lines.

2. Description of the Prior Art

Integrated circuits are now well known and, in recent years have become increasingly complex and densely integrated. The electrical elements within the integrated circuits have also been constructed according to higher performance designs, usually involving an increased number of layers in the construction thereof. Even simple integrated circuits invariably require some electrical connections between individual elements, such as transistors, of which the integrated circuit is constituted.

As complexity, density and circuit element performance has increased, the difficulty of making connections has increased. The success of making such connections has been limited because of the inherent physical properties of the materials used while there have been substantial increases in the quality required in such connections. For instance, as chip size has increased connections of increased length have been required. As integration density has increased, the width of connections has decreased. Further, increased integration density often requires a connection to traverse severe topology, which can engender connection defects while ever greater defect free lengths of connection must be formed. Even if connections can be formed with acceptable manufacturing yields under such conditions, increased length and reduced width both contribute to increased resistance of the connection, particularly when the connections must be formed of semiconductor materials.

Specifically, highly conductive materials such as copper and tungsten cannot generally be used other than at the surface of the integrated circuit (e.g. over all active layers but beneath a final protective oxide layer) due to difficulty in dry etching and patterning of such materials. The formation of metal connections at lower levels is also made difficult since further processing at high temperatures causes silicidation of the metals which causes such connections to become discontinuous over severe topology. Therefore, at lower levels of the integrated circuit, metal silicide (e.g. polysilicon which has undergone silicidation) connections, such as $TiSi_2$, have been typically used. However, this material is particularly susceptible of becoming discontinuous when deposited over severe topologies of complex, multi-layered integrated circuit structures and also limits conductivity to the 100-200 $\mu$ohm-cm range.

Further, it is clear that all connections required in an integrated circuit cannot be made in the same layer because complex circuits will seldom be free of crossing conductors. The formation of insulators for such crossing conductors requires additional processing steps, increasing integrated circuit cost, and complicates the roughness of the topology over which such connections must be formed. As the number of layers of the integrated circuit is increased, the roughness of the topology of the integrated circuit simultaneously increases the defect-free length of conductor which is required and increases the likelihood of a defect occurring within any given length of conductor.

Additionally, both conductors and insulators must be formed at each level, substantially increasing the number of processing steps for each additional layer of connections which is required in the device. The number of processing steps is also increased in the present technology by the additional steps required to form studs for interconnecting different connection layers.

Further, voltage drops within an integrated circuit can pose limitations on design both from the standpoint of heat dissipation and operating voltage margins. No method has heretofore existed to allow connections to be made with low resistance metals at lower layers within the integrated circuit device.

SUMMARY OF THE INVENTION

It is therefore an object of the present invention to provide a technique by which metal connections may be made at any level of an integrated circuit.

It is another object of the invention to provide a stable connector structure which will provide a higher conductivity connection than metal silicide which will remain continuous over severe topologies in integrated circuits.

It is a further object of the invention to provide a technique of forming metal connections which can be used at levels which do not interfere with surface metallization connections.

It is another further object of the invention to provide a technique by which studs connecting different layers of an integrated circuit and connections at a plurality of levels may be simultaneously formed, in order to reduce the number of processing steps.

In order to achieve the above and other objects of the invention, a method of forming a connection is provided including the steps of forming a cavity between a surface and a protective layer formed over that surface, and filling at least a portion of the cavity with metal by a metal deposition process.

In accordance with another aspect of the invention, a connection is provided which is formed by the process including the steps of forming a cavity between a surface and a protective layer formed over that surface, and filling at least a portion of the cavity with metal by a metal deposition process.

In accordance with a further aspect of the invention, a connection for an integrated circuit is provided including a deposit of metal partially in the shape of a void formed below a protective layer.

In accordance with yet another aspect of the invention, a method of forming a metal connection of a desired shape in an integrated circuit device is provided including the steps of depositing a sacrificial material on a surface in a desired shape, depositing a protective layer over the sacrificial material, forming at least one bore opening from a surface of the protective layer to the sacrificial material, removing the sacrificial material to form a cavity overlaid by at least a portion of the protective layer, and depositing metal in the cavity.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
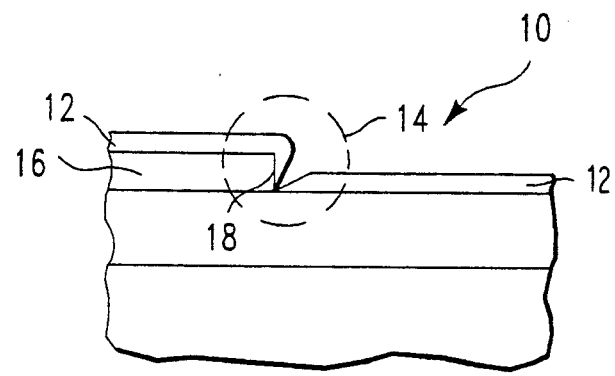
FIG. 1 is a cross-section of a typical integrated circuit topology showing a typical metal polycide connection, as known in the prior art.

Referring now to the drawings, and more particularly to FIG. 1, there is shown a typical connection over severe topology of integrated circuit 10 with a polysilicon or metal silicide connection 12 which has become discontinuous at the dashed circle indicated by reference numeral 14. In this case, depositing such a connection 12 across the edge of a thick layer does not result in uniform deposition due to the severe topology at the edge 18 of layer 16. This can directly result in a discontinuity, as shown, or the connection may later become discontinuous due to fatigue, migration, diffusion or other mechanisms usually due to heat treatment or high temperature processes during fabrication of the remainder of the integrated circuit. If the connection is made successfully and later becomes defective, a particularly high degree of economic waste will occur since additional manufacturing steps will have been performed, increasing the cost of an integrated circuit which must ultimately be discarded.

Figure 2:
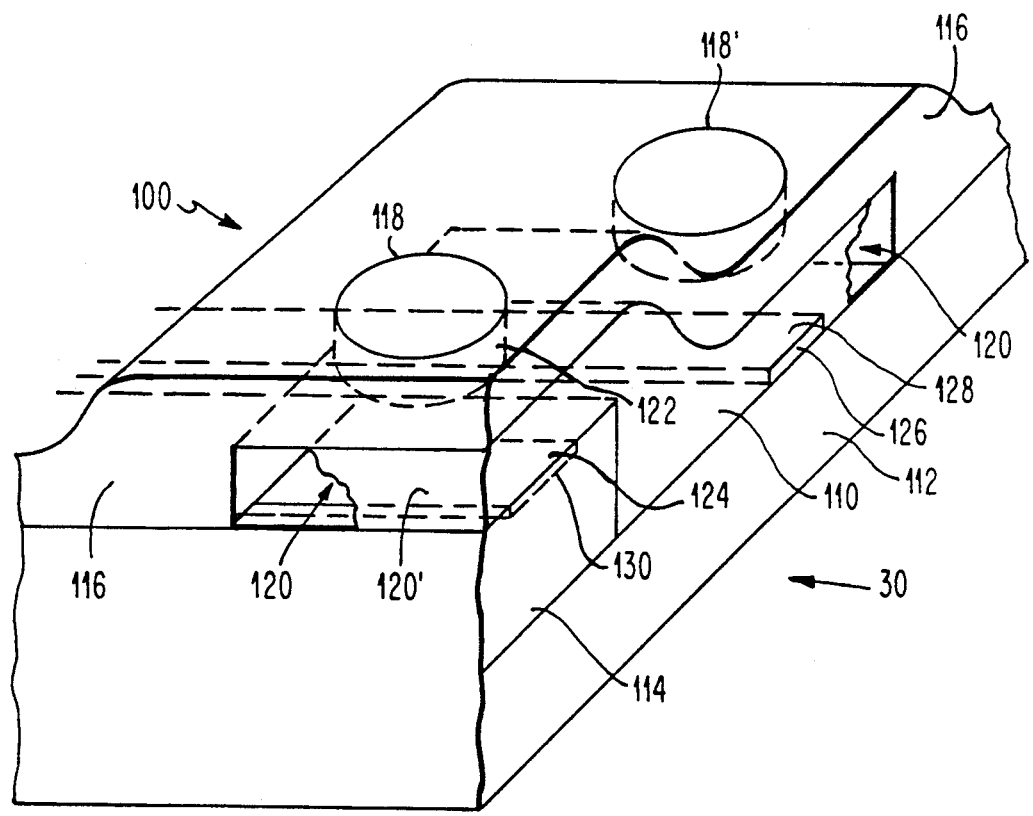
FIG. 2 is an isometric view of a section of an integrated circuit employing the invention.

Referring now to FIG. 2, the connection structure 100 of the invention is shown in section and in an isometric view. According to the invention, the connection is made by a process somewhat similar to the "cire perdue" or "lost wax" process for producing extremely high quality and detailed metal castings. In the lost wax technique, the original model was originally produced (or reproduced) in wax and a mold was formed around it from a material which would withstand the high temperature of the metal from which a casting was to be made. After the mold was complete, holes were made through the mold to the wax model. The wax was then removed from the mold by heating the mold, thus destroying the wax original (and, hence, the term "lost wax"), and the casting could then proceed by pouring molten metal or some other material into the mold. Metal formed in the holes in the mold during casting was then removed by cutting or abrasion or both.

Accordingly, in the process for forming invention 100, as shown in FIG. 2, a sacrificial layer or film 110 is formed by deposition of a material such as a metal oxide which can be deposited more uniformly than polysilicon or metal silicide on an underlying layer 112 and, potentially, over a conductor or other structure 114 which may represent severe topology similar to that of FIG. 1. This sacrificial layer 110 is preferably a material which can be readily etched. The conductor shape thus formed is then encapsulated with a protective layer 116 such as silicon dioxide. At least one hole 118, 118' is made through the protective layer 116 to the sacrificial layer or film 110 and the device subjected to etching to remove the sacrificial layer, thus forming a cavity in the desired three-dimensional shape which the connection is to have. Then the cavity or "tunnel" 120 (shown in FIG. 2 in cut-away form) remaining after the removal of the sacrificial layer or film 110, and at least partially overlaid by the protective layer 116, can be filled with metal by a deposition process and excess conductor metal, such as at studs 122, can be removed by polishing, if desired.

It should be noted that this technique can be performed through any number of layers in addition to the protective layer and very large numbers of connections could be simultaneously made, including connections at many different levels of the integrated circuit device. It should also be noted that once the sacrificial layer or film 110 has been produced at the correct location and holes made to reach the sacrificial layer for etching, the remainder of the process is effectively self-aligned, avoiding the need for patterning and dry etching of a metallization layer forming the connection, as was required in the prior art. Further, connection studs 122 are simultaneously formed which may be useful in other steps of fabrication of the integrated circuit device. It should also be noted that layer 114 need not be thick and could include a polysilicon or polycide connection on surface 124, as indicated by dashed line 130 or at a location such as that indicated at 126. If so, it is desirable, as known in the art, to provide a metal silicide coating (not shown) on surfaces 124 and 128 to improve adhesion of the metal contacts. In accordance with the invention, this may be done after removal of the sacrificial layer 110 through holes 118, prior to deposition of metal in tunnel 120. This process will also be self aligned and does not require any additional steps beyond that of depositing the metal silicide, itself.

Referring now to FIGS. 3-6, the process steps for forming connections in accordance with the invention as shown in FIG. 2 will be described according to a preferred method of carrying out the invention. Reference numerals which are also common to FIG. 2 will be used insofar as is possible. The view shown in FIGS. 3-6 is similar to the view provided in prior art FIG. 1 and corresponds to a view of a section of the invention indicated by arrow 30 in FIG. 2.

Figure 3:
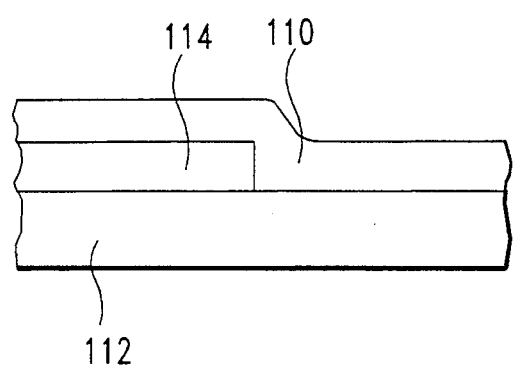
FIGS. 3-6 are cross-sectional views showing integrated circuit topology similar to FIG. 1 and illustrating steps used in the formation of a metal connection in accordance with the invention and FIGS. 7, 8, 9, 10 and 11 are isometric views illustrating a variation of the invention shown in FIGS. 2-6.

Referring now to FIG. 3, it is assumed that the process begins with a partially completed integrated circuit including, for purposes of illustration, layers 112 and 114, one of which could be the device substrate. Many more levels and more complex topology could, of course, be present. It is deemed preferable to first deposit a layer or film 110 of conformal aluminum oxide ($Al_2O_3$) to a thickness of approximately 2000 Angstroms using a process at a temperature below 500° C. to provide a silicon dioxide etch stop. Other films such as $Sc_2O_3$ or $Yt_2O_3$ are also suitable for this purpose. This film is then patterned using a wet etch, preferably with $H_3PO_4$ or sputtering, depending on dimensions, to leave a pattern corresponding to desired connections and contact studs. This patterning is preferably done with a photoresist mask (not shown) which is removed after patterning of the film 110.

Figure 4:
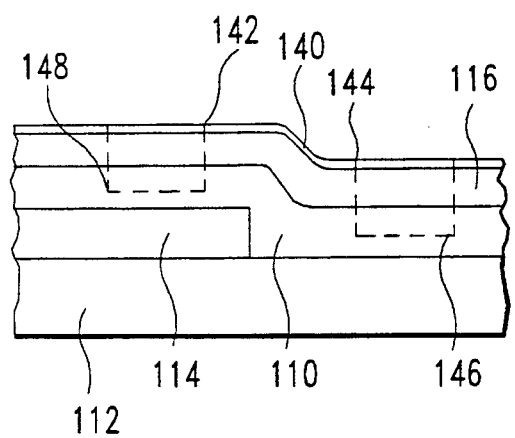

Referring now to FIG. 4, a protective layer 116 is applied over a desired portion of the surface of the integrated circuit and a mask 140 is applied over it and patterned at 142, 144 for stud drilling to the sacrificial layer 110. A photoresist mask is also suitable for this purpose. The stud drilling is preferably done with a reactive ion etch. This etching process should be carried out to a depth well within the sacrificial layer 110 to provide a large initial etching surface within the sacrificial layer 110, allowing the subsequent etching step to proceed with greatest speed. It is also preferable, for the same reason, to provide at least two, or preferably more, stud holes 146, 148 for each conductor to be formed. The stud drilling should also preferably employ an etchant which will provide generally unidirectional etching to avoid undercutting masked areas.

After stud drilling is complete, mask 140 may be removed. It will be appreciated that protective layer 116 remains to form a mask for areas not involved in the production of conductors in accordance with the invention, Protective layer 116 thus allows the process according to the invention to be carried out even if structures including materials such as that of the sacrificial layer are present on the surface of the structure at the start of the process. Thus, a reactive ion etch, preferably with an etchant specific to the material of the sacrificial layer and providing etching thereof in non-preferential directions, such as $H_3PO_4$ may be carried out to remove the sacrificial layer. When this process is complete, only tunnel 120 remains beneath the protective layer 116 in locations where sacrificial layer or film 110 had been deposited.

Figure 5:
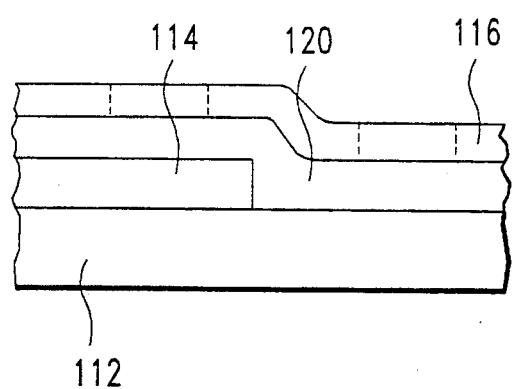
Figure 6:
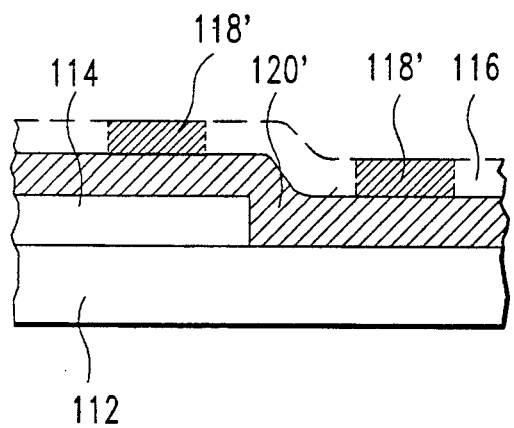

Referring now to FIG. 6, the formation of the connection is completed by depositing metal, preferably Copper or Tungsten, in tunnel 120 of FIG. 5, preferably by a chemical metal deposition process or combination of several such processes as will be described below. The deposit of metal within the cavity 120 thus forms connection 120' illustrated by hatching in FIG. 6. This process will also leave upstanding metal studs 118, 118' in holes in protective layer 116 which may or may not be removed, as desired. Studs 118, 118' also may be removed, if desired, by any of a plurality of known etching or polishing methods.

Suitable processes for metal deposition, collectively referred to above as a metal deposition process include sputtering, evaporation and chemical vapor deposition. As indicated above, combinations of these processes can be used. The preferred method of metal deposition begins by sputtering of tungsten to form a nucleating layer within the cavity which may or may not be continuous within the cavity. Sputtering is followed by chemical vapor deposition (CVD) which proceeds with enhanced speed since the deposited metal nucleates on the surface of the sputtered metal. Evaporation is considered less effective for filling reentrant portions of the connections such as within cavity 120 but works well in volumes such as studs 118, 118'.

It should be noted that in some instances, it may be desirable to leave protective layer 116 in place since such a layer may form a portion of a planarizing layer for facilitating the addition of surface wiring. In this regard, it is also to be understood that the invention also provides a technique for accomplishing multi-layer surface or lower level wiring with stud 118 serving to provide connections between the layers. Such multi-layer wiring can be accomplished merely by depositing a sacrificial layer where connections will be required. The etching away of the sacrificial layer and the metal deposition can be done a single time to simultaneously form connections at a plurality of levels within the integrated circuit. Alternatively, the procedure illustrated in FIGS. 3-6 may be repeated a plurality of times, as specific circuit designs may require.

It should also be noted in this regard that the deposition of metal is done after the formation of subsequent layers. Since the formation of those subsequent layers may require high temperature steps, the invention may be employed to defer metal deposition to later steps and thus minimize silicidation of metal at lower levels of the integrated circuit.

Referring now to FIGS. 7-11, a variation of the invention will now be described. In this variation of the invention described above, a defect is introduced into the layered structure which facilitates the etching process. Further, particularly since etching is facilitated, a portion of the protective layer (e.g. 116 in FIG. 5) serves as the sacrificial layer (e.g. 110 in FIG. 4), avoiding the need to separately deposit a different sacrificial material.

Figure 7:
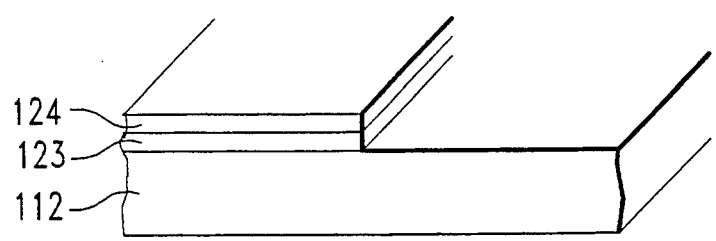
Figure 8:
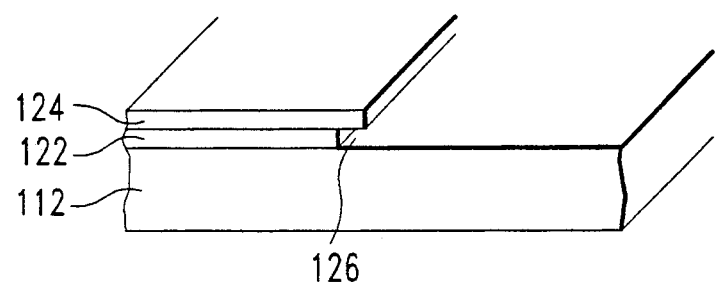
Figure 9:
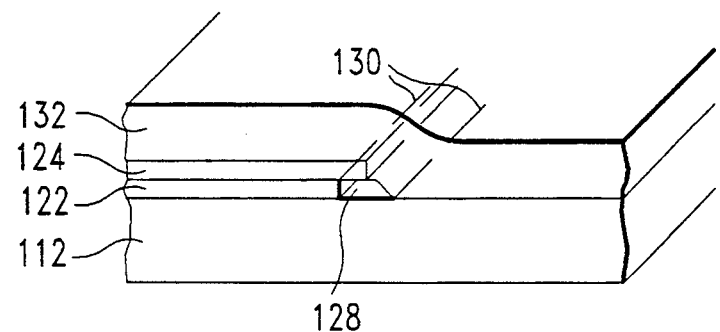

Specifically, with reference to FIG. 7, layer 122 of, for instance, silicon oxide, and layer 124 of, for instance silicon nitride are deposited by known techniques and patterned, as desired. Then, as shown in FIG. 8, the structure is subjected to etching to undercut the edge of layer 124 by removal of a portion of layer 122 as indicated at 126. This undercut 126 which results in layer 124 overhanging the edge of layer 122 will produce a void 128 in the structure when protective layer 132 of, for example, silicon oxide is deposited. This void will extend anywhere overhang 126 exists and will form a tunnel-like cavity therealong as indicated by dashed lines 130.

Figure 10:
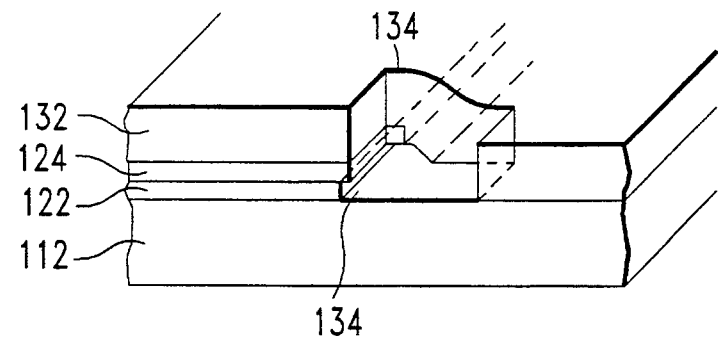

Subsequently, as shown in FIG. 10, an opening 134 is made through protective layer 132 to reach the defect or void. This opening is preferably formed by the use of a mask which is not shown in FIG. 10 or FIG. 11 in the interest of clarity. A portion of the silicon nitride layer 124 may be removed in the course of this process. Opening 134 then provides for communication from the void or defect to the surface of the structure so that further etching can be performed to enlarge the tunnel 128, if desired. It is to be understood, however, that if the cross-sectional dimensions of the tunnel-like void are made sufficiently large by extending undercut 126, further etching could be omitted and the interior of the tunnel-like void merely back-filled by metal deposition processes, such as those described above or combinations thereof, to form a conductor in the same manner as conductor 120', as shown in FIG. 5. Nevertheless, some etching may be desirable to assure good surface conditions in the void 128 and hole 134 to enhance metal adhesion to interior surfaces thereof. It is contemplated, however, that etching will be used to enlarge the tunnel-like void to form cavity 138, bounded by lines 136 as shown in FIG. 11.

Figure 11:
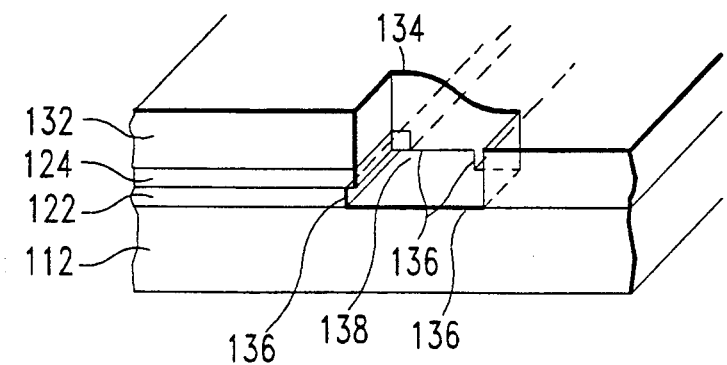

Thus, by comparison of FIGS. 10 and 11, it is seen that a portion of the protective layer 132 is made to function as a sacrificial layer, as indicated above. The connection can then be formed by back-filling the void with metal, as in the embodiment of FIGS. 2-6.

It should be noted that this alternative variation of the invention may be preferable to that shown in FIGS. 2-6 in some applications where deposition of a sacrificial layer may not be convenient. It is also deemed desirable since etching of the sacrificial portion of the protective layer can be done very rapidly due to both crystal grain defects occurring at the boundary of the void 128 which enhances etching rate and the large surface of the void. It is also to be understood that the differential etching rates at the defect location will be sufficiently greater than at the perimeter of hole 134 and the surface of protective layer 132, that a protective mask is not usually necessary although a mask could be used, if desired.

The process of FIGS. 7-11 may also be preferable to that of FIGS. 2-6 because etching proceeds rapidly in a direction transverse to the length of the conductor to be formed rather than lengthwise during removal of the sacrificial material of the embodiment of FIGS. 2-6. Therefore, even though higher etching rates may be easily achieved in the sacrificial material 110 of FIGS. 2-6 than in the sacrificial portion of the protective layer 132 of FIGS. 7-11, the latter process may allow the etching time to be significantly reduced. Thus the short etching time also reduces the degree of etching occurring at the perimeter of hole 134 and on surface 132. Also, due to the formation of undercut 126, continuity of the cavity 134 is assured.

In view of the foregoing, it is seen that the method of the present invention provides for the formation of high conductivity metal connections at any level within an integrated circuit structure and provides a technique where such connections can be made in a location which does not interfere with surface wiring of the device.

While the invention has been described in terms of a single preferred embodiment and an alternative variation thereof in only an exemplary configuration, those skilled in the art will recognize that the invention can be practiced with modification and applied to many different topologies and semiconductor structures and materials within the spirit and scope of the appended claims.

Having thus described my invention, what I claim as new and desire to secure by Letters Patent is as follows:

1. A method of forming a metal interconnection extending between at least two interconnection points including the steps of
    forming a cavity between a surface and a protective layer formed over said surface, and
    depositing metal in said cavity conforming to a portion of an interior surface of said cavity and extending through said cavity between said at least two interconnection points.

2. A method as recited in claim 1, including the further step of
    forming an aperture from a surface of said protective layer to said cavity.

3. A method as recited in claim 1, wherein said protective layer is formed over a volume of sacrificial material and including the further step of
    removing said volume of sacrificial material.

4. A method as recited in claim 1, wherein said step of forming a cavity includes the steps of
    undercutting an edge of a layer of material, and
    depositing the protective layer over said undercut edge to form a void.

5. A method as recited in claim 4, including the further step of removing a sacrificial portion of said protective layer.

6. A method as recited in claim 3, wherein said volume of sacrificial material is a metal oxide.

7. A method of forming a metal interconnection within an integrated circuit device including the steps of
    depositing a sacrificial material on a surface,
    depositing a protective layer over said sacrificial material,
    forming at least two bore openings from a surface of said protective layer to said sacrificial material,
    removing said sacrificial material to form a cavity overlaid by at least a portion of said protective layer, and
    depositing metal in said cavity, said metal deposited by said depositing step extending through said cavity between said at least two bore openings.

8. A method of forming a metal connection in a semiconductor electronic device having a layered structure, said method including the steps of
    forming a void in said layered structure of said electronic device, said void having a dimension extending between two locations in a layer of said layered structure,
    enlarging said void by simultaneously etching surfaces along the entirety of said dimension, and
    depositing metal throughout said dimension of said void.

* * * * *